United States Patent
Barua et al.

(12)

(10) Patent No.: US 12,278,637 B2
(45) Date of Patent: Apr. 15, 2025

(54) HDLC DATA RECEPTION USING SIGNAL PULSE WIDTHS

(71) Applicant: Applied Materials, Inc., Santa Clara, CA (US)

(72) Inventors: Roshan K. Barua, Medford, MA (US); Gregg Norris, Rockport, MA (US); Feng Wang, Salem, MA (US)

(73) Assignee: Applied Materials, Inc., Santa Clara, CA (US)

( * ) Notice: Subject to any disclaimer, the term of this patent is extended or adjusted under 35 U.S.C. 154(b) by 164 days.

(21) Appl. No.: 18/084,202

(22) Filed: Dec. 19, 2022

(65) Prior Publication Data

US 2024/0204762 A1 Jun. 20, 2024

(51) Int. Cl.
*H03K 7/08* (2006.01)
*H04J 3/24* (2006.01)

(52) U.S. Cl.
CPC ............. *H03K 7/08* (2013.01); *H04J 3/247* (2013.01)

(58) Field of Classification Search
CPC .................................. H03K 7/08; H04J 3/247
See application file for complete search history.

(56) References Cited

U.S. PATENT DOCUMENTS

| | | | | |
|---|---|---|---|---|
| 4,951,278 A | * | 8/1990 | Biber | H04L 9/40 370/474 |
| 5,047,927 A | | 11/1991 | Sowell et al. | |
| 6,539,023 B1 | * | 3/2003 | Bartholomay | H04L 49/9094 370/412 |
| 6,678,321 B1 | * | 1/2004 | Graham | H03K 7/08 375/369 |
| 2012/0137020 A1 | | 5/2012 | Ehlers | |
| 2020/0076503 A1 | | 3/2020 | Croughwell, III et al. | |
| 2020/0144018 A1 | | 5/2020 | Koo et al. | |
| 2021/0266930 A1 | | 8/2021 | Wilcoxson et al. | |
| 2021/0305011 A1 | | 9/2021 | Sinclair et al. | |
| 2022/0057851 A1 | | 2/2022 | Yam et al. | |
| 2022/0204762 A1 | | 6/2022 | Tsai | |

FOREIGN PATENT DOCUMENTS

| | | | |
|---|---|---|---|
| EP | 643546 A2 * | 3/1995 | ......... H04Q 11/0471 |
| JP | 7082197 B2 | 6/2022 | |
| TW | 202018779 A | 5/2020 | |

(Continued)

OTHER PUBLICATIONS

Lattice Semiconductor Corporation, HDLC Controller Implemented in MachXO, LatticeXP2 and LatticeECP2/M Families. Jun. 2010.

(Continued)

*Primary Examiner* — Freshteh N Aghdam
(74) *Attorney, Agent, or Firm* — Nields, Lemack & Frame, LLC (57) ABSTRACT

A system and method of receiving HDLC communications is disclosed. The system measures the pulse width of the incoming signal and converts each pulse into a series of bits, based on its pulse width. In this way, the reception of the HDLC communication is not dependent on any particular clock rate and is adaptable. The system takes advantages of the fact that the flag is a string of six consecutive bits that are all "1". Thus, the longest positive pulse width may be used to determine the bit rate. This allows the system to operate over a very broad range of data rates.

13 Claims, 7 Drawing Sheets

(56) References Cited

FOREIGN PATENT DOCUMENTS

TW          202138746 A     10/2021
TW          202220015 A     5/2022

OTHER PUBLICATIONS

Semira et al., Implementation of a Single-Channel HDLC Controller on FPGA. International Journal of Computer Applications. vol. 131, No. 3, Dec. 2015.

International Search Report and Written Opinion mailed Feb. 28, 2024 in corresponding PCT application No. PCT/US2023/081161.

\* cited by examiner

HDLC DATA RECEPTION USING SIGNAL PULSE WIDTHS

Embodiments of the present disclosure relate to a system and method of receiving HDLC communications, and more specifically using pulse widths to determine contents of an incoming data stream.

BACKGROUND

HDLC (High-level Data Link Control) is a protocol used to transmit bits serially between different devices. This protocol may be used in various environments. HDLC is a serial interface, where a flag is used to denote the start and end of a packet. The packet also includes an address field, a control field, information and a field check sequence.

In most systems, this protocol is implemented using dedicated HDLC controllers, or custom made devices that implement the HDLC protocol. Thus, systems that implement HDLC may be burdened with additional costs due to these components.

Additionally, devices that utilize HDLC may be connected using a daisy chain configuration. Due to pulse width constraints, there may be a limit on the number of devices that may be daisy chained together. Specifically, due to the inherent nature of optic transceivers, as the signal travels through the daisy chain, the pulse width is shortened after each device in the daisy chain. At some point, the pulse width may become sufficiently short that it may not be captured by the device.

Therefore, it would be beneficial if there were a system and method of receiving HDLC communications that did not rely on a fixed data rate or crystal.

SUMMARY

A system and method of receiving HDLC communications is disclosed. The system measures the pulse width of the incoming signal and converts each pulse into a series of bits, based on its pulse width. In this way, the reception of the HDLC communication is not dependent on any particular clock rate and is adaptable. The system takes advantages of the fact that the flag is a string of six consecutive bits that are all "1"s. Thus, the longest positive pulse width may be used to determine the bit rate. This allows the system to operate over a very broad range of data rates.

According to one embodiment, a microcontroller for receiving HDLC packets is disclosed. The microcontroller comprises a processing unit; an edge detector/timer circuit; a memory device in communication with the processing unit, containing instructions, which when executed by the processing unit, enable the microcontroller to: use the edge detector/timer circuit to record durations of a plurality of pulse widths of an incoming signal, wherein the incoming signal is a HDLC packet; determine a bit rate based on the durations of the plurality of pulse widths; and reconstruct the HDLC packet based on the bit rate previously determined. In some embodiments, an array of pulse widths is stored, and the processing unit uses values in the array of pulse widths to determine a bit time, defined as a time to transmit one bit, and divides the array of pulse widths by the bit time to create an array of bit pulse widths, where each value in the array of bit pulse widths is indicative of a number of bits in each pulse. In certain embodiments, the processing unit defines a smallest pulse width as the bit time. In certain embodiments, the processing unit uses a longest positive pulse width to determine the bit time. In certain embodiments, the processing unit uses a longest positive pulse width and a second pulse width to determine the bit time. In certain embodiments, the processing unit uses the array of bit pulse widths to reconstruct the HDLC packet. In some embodiments, the edge detector/timer circuit records a timestamp for each transition of the incoming signal, and the timestamps are stored in the memory device. In some embodiments, the durations of the plurality of pulse widths are calculated by subtracting each timestamp from an adjacent timestamp. In some embodiments, the edge detector/timer circuit times a duration between transitions of the incoming signal and records the durations of the plurality of pulse widths.

According to another embodiment, a microcontroller for receiving HDLC packets is disclosed. The microcontroller comprises a processing unit; an edge detector/timer circuit; a memory device in communication the with processing unit, containing instructions, which when executed by the processing unit, enable the microcontroller to: use the edge detector/timer circuit to monitor transitions of an incoming signal, wherein the incoming signal is a HDLC packet; and reconstruct the HDLC packet based on monitored transitions; the wherein the microcontroller reconstructs the HDLC packet without use of a clock signal that is phase locked to the incoming signal. In some embodiments, the processing unit calculates a duration of a plurality of pulse widths based on the transitions of the incoming signal. In some embodiments, the processing unit determines a bit rate of the incoming signal based on the plurality of pulse widths.

According to another embodiment, beamline ion implantation system is disclosed. The beamline ion implantation system comprises a plurality of components defining a beamline, comprising an ion source, a mass analyzer, a mass resolving aperture, at least one acceleration or deceleration stage, a collimator, and a platen; and a main controller, in communication with one or more of the plurality of components, wherein at least one component of the one or more of the plurality of components comprises any of the microcontrollers described above.

According to another embodiment, a spot beam implementation system is disclosed. The spot beam implementation system comprises a plurality of components defining a beamline, comprising an ion source, a mass analyzer, a mass resolving aperture, a scanner, an angle corrector and a platen; and a main controller, in communication with one or more of the plurality of components, wherein at least one component of the one or more of the plurality of components comprises any of the microcontrollers described above.

According to another embodiment, a plasma doping system is disclosed. The plasma doping system comprises a plurality of components, comprising a plasma chamber, an RF antenna, an RF power supply, a platen, a bias power supply, a mass analyzer, a mass resolving aperture, a scanner, an angle corrector and a platen; and a main controller, in communication with one or more of the plurality of components, wherein at least one component of the one or more of the plurality of components comprises any of the microcontrollers described above.

BRIEF DESCRIPTION OF THE FIGURES

For a better understanding of the present disclosure, reference is made to the accompanying drawings, which are incorporated herein by reference and in which.

DETAILED DESCRIPTION

Figure 5:
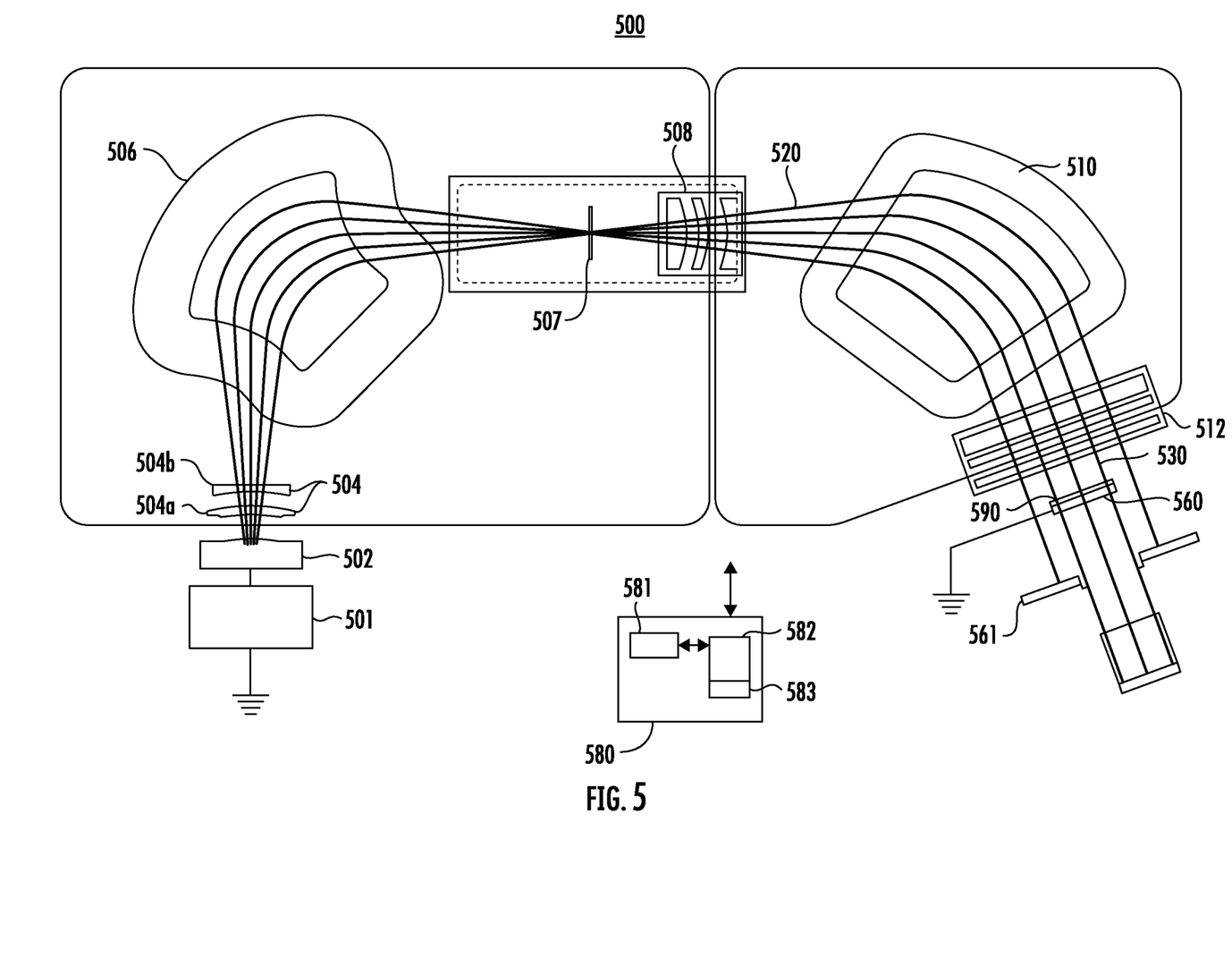
FIG. 5 is an ion implantation system in accordance with one embodiment that may use the HDLC system and method described herein.

As described above, many devices use HDLC to communicate. In some embodiments, HDLC may be used in semiconductor processing systems. One such semiconductor processing system is shown in FIG. 5. FIG. 5 shows a beamline ion implantation system 500 that utilizes a ribbon ion beam. As illustrated in the figure, the beamline ion implantation system 500 may comprise an ion source and a complex series of beam-line components through which an ion beam 520 passes. The ion source may comprise an ion source chamber 502 where ions are generated. The ion source may also comprise a power source 501 and an extraction electrode 504 disposed near the ion source chamber 502. The extraction electrodes 504 may include a suppression electrode 504a and a ground electrode 504b. Each of the ion source chamber 502, the suppression electrode 504a, and the ground electrode 504b may include an aperture. The ion source chamber 502 may include an extraction aperture (not shown), the suppression electrode may include a suppression electrode aperture (not shown), and a ground electrode may include a ground electrode aperture (not shown). The apertures may be in communication with one another so as to allow the ions generated in the ion source chamber 502 may pass through, toward the beam-line components.

The beamline components may include, for example, a mass analyzer 506, a mass resolving aperture 507, a first acceleration or deceleration (A1 or D1) stage 508, a collimator 510, and a second acceleration or deceleration (A2 or D2) stage 512. Much like a series of optical lenses that manipulate a light beam, the beamline components can filter, focus, and manipulate ions or ion beam 520. The ion beam 520 that passes through the beamline components may be directed toward the workpiece 590 that is mounted on a platen 560. The incoming ion beam 530 is much wider in the first direction than in the second direction and may be wider than the diameter of the workpiece 590 in the first direction. The direction of travel for the incoming ion beam 530, which is perpendicular to the first direction and the second direction, may be referred to as its trajectory. The workpiece 590 may be moved in one or more dimensions by the platen 560. For example, the platen 560 may move in the second direction (which corresponds to the height of the incoming ion beam 530) so that, after the platen 560 has moved from its first position to its second position, the entire workpiece 590 is exposed to the incoming ion beam 530. A current profiler 561 may be disposed near the platen 560 to capture the actual beam current. Of course, other components may also be part of the beamline ion implantation system.

A main controller 580 is also used to control the implantation. The main controller 580 has a processing unit 581 and an associated memory device 582. This memory device 582 contains the instructions 583, which, when executed by the processing unit 581, enable the system to perform the functions to control the beamline ion implantation system 500. This memory device 582 may be any non-transitory storage medium, including a non-volatile memory, such as a FLASH ROM, an electrically erasable ROM or other suitable devices. In other embodiments, the memory device 582 may be a volatile memory, such as a RAM or DRAM. In certain embodiments, the main controller 580 may be a general purpose computer, an embedded processor, or a specially designed microcontroller. The actual implementation of the main controller 580 is not limited by this disclosure.

The main controller 580 may receive input signals from a variety of systems and components and provide output signals to each to control the same. For example, the main controller 580 may control the flow of gas to the ion source chamber 502. Further, the main controller 580 may control the voltages applied to various electrodes in the beamline ion implantation system. Additionally, the main controller 580 may control the magnetic field provided by the mass analyzer 506. Additionally, the main controller 580 may also receive inputs, such as current profile information from the current profiler 561. The communication between the main controller 580 and each of these components may be made using HDLC.

Figure 6:
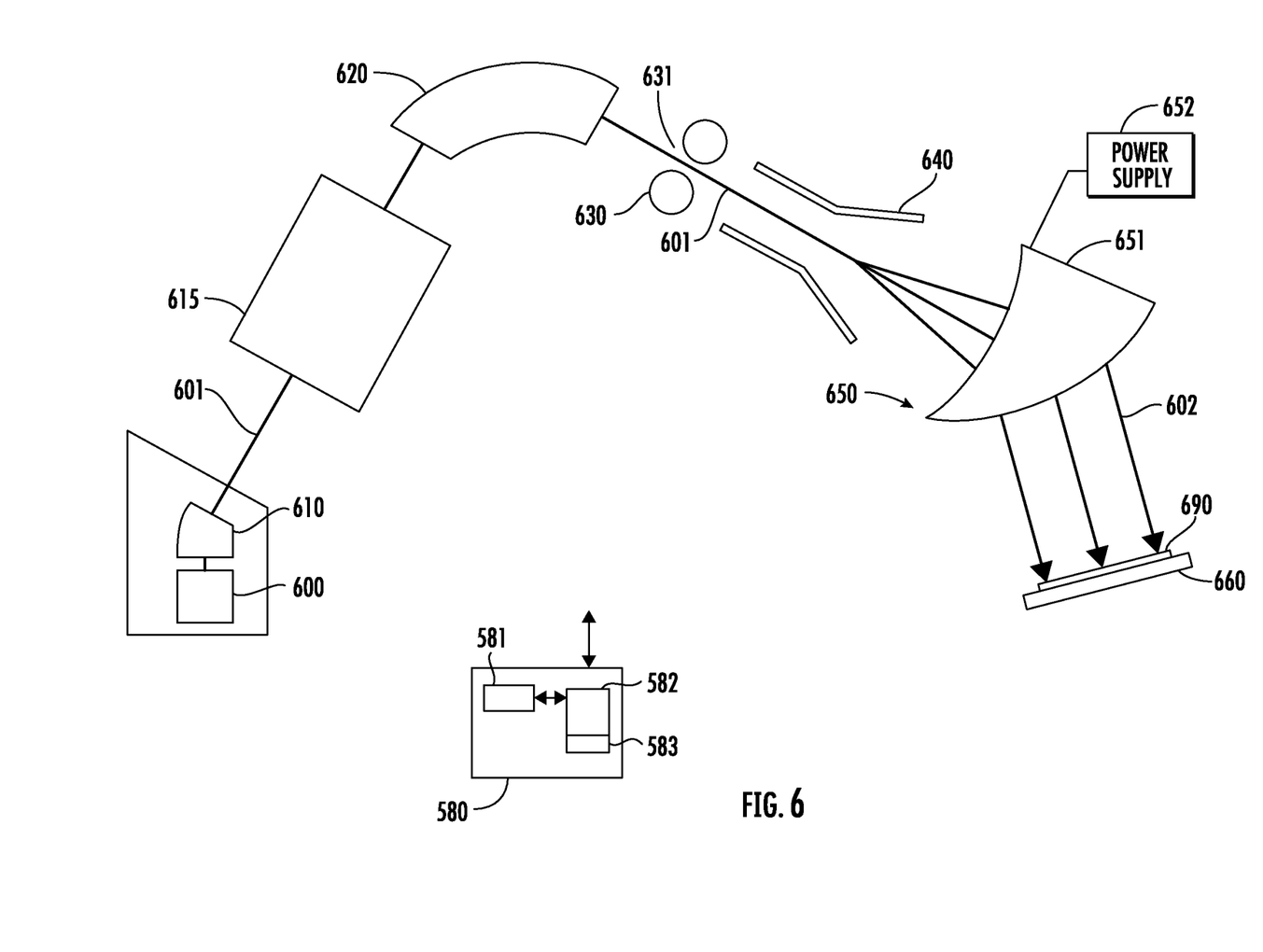
FIG. 6 is spot beam ion implantation system in accordance with one embodiment that may use the HDLC system and method described herein.

FIG. 6 shows another embodiment of a semiconductor processing system. In this embodiment, the semiconductor processing system includes a spot beam ion implantation system. The spot beam ion implantation system includes an ion source 600 comprising a plurality of chamber walls defining an ion source chamber. In certain embodiments, the ion source 600 may be an RF ion source. In this embodiment, an RF antenna may be disposed against a dielectric window. This dielectric window may comprise part or all of one of the chamber walls. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 100 MHz. Further, the power supplied by the RF power supply may be pulsed.

In another embodiment, a cathode is disposed within the ion source chamber. A filament is disposed behind the cathode and energized so as to emit electrons. These electrons are attracted to the cathode, which in turn emits electrons into the ion source chamber. This cathode may be referred to as an indirectly heated cathode (IHC), since the cathode is heated indirectly by the electrons emitted from the filament.

Other embodiments are also possible. For example, the plasma may be generated in a different manner, such as by a Bernas ion source, a capacitively coupled plasma (CCP) source, microwave or ECR (electron-cyclotron-resonance) ion source. The manner in which the plasma is generated is not limited by this disclosure.

One chamber wall, referred to as the extraction plate, includes an extraction aperture. The extraction aperture may be an opening through which the ions 601 generated in the ion source chamber are extracted and directed toward a workpiece 690. The extraction aperture may be any suitable shape. In certain embodiments, the extraction aperture may be oval or rectangular shaped.

Disposed outside and proximate the extraction aperture of the ion source 600 is a source filter 610.

Located downstream from the source filter 610 is a mass analyzer 620. An acceleration/deceleration column 615 is positioned between source filter 610 and mass analyzer 620. The mass analyzer 620 uses magnetic fields to guide the path of the extracted ions 601. The magnetic fields affect the flight path of ions according to their mass and charge. A mass resolving device 630 that has a resolving aperture 631 is disposed at the output, or distal end, of the mass analyzer 620. By proper selection of the magnetic fields, only those ions 601 that have a selected mass and charge will be directed through the resolving aperture 631. Other ions will strike the mass resolving device 630 or a wall of the mass analyzer 620 and will not travel any further in the system. The ions that pass through the mass resolving device 630 may form a spot beam.

The spot beam may then enter a scanner 640 which is disposed downstream from the mass resolving device 630. The scanner 640 causes the spot beam to be fanned out into a plurality of divergent ion beamlets. In other words, the scanner 640 creates diverging ion trajectory paths. The scanner 640 may be electrostatic or magnetic. The scanner 640 may comprise spaced-apart scan plates connected to a scan generator. The scan generator applies a scan voltage waveform, such as a sawtooth waveform, for scanning the ion beam in accordance with the electric field between the scan plates. Angle corrector 650 is designed to deflect ions in the scanned ion beam to produce scanned ion beam 602 having parallel ion trajectories, thus focusing the scanned ion beam. Specifically, the angle corrector 650 is used to alter the diverging ion trajectory paths into substantially parallel paths of a scanned ion beam 602. In particular, angle corrector 650 may comprise magnetic pole pieces 651 which are spaced apart to define a gap and a magnet coil (not shown) which is coupled to a power supply 652. The scanned ion beam 602 passes through the gap between the magnetic pole pieces 651 and is deflected in accordance with the magnetic field in the gap. The magnetic field may be adjusted by varying the current through the magnet coil. Beam scanning and beam focusing are performed in a selected plane, such as a horizontal plane.

The workpiece 690 is disposed on a movable workpiece holder 660. Of course, other components may also be part of the spot beam ion implantation system.

The main controller 580 has a processing unit 581 and an associated memory device 582. This memory device 582 contains the instructions 583, which, when executed by the processing unit 581, enable the system to control the spot beam ion implantation system. This memory device 582 may be any non-transitory storage medium, including a non-volatile memory, such as a FLASH ROM, an electrically erasable ROM or other suitable devices. In other embodiments, the memory device 582 may be a volatile memory, such as a RAM or DRAM. In certain embodiments, the main controller 580 may be a general purpose computer, an embedded processor, or a specially designed microcontroller. The actual implementation of the main controller 580 is not limited by this disclosure. The main controller 580 may control various components in the spot beam ion implantation system. For example, the main controller 580 may control the voltages applied to the electrodes in the system. The main controller 580 may also control the scanner 640, the power supply 652, the magnetic fields in the mass analyzer 620, and other components. The main controller 580 may also receive inputs from other components. The communication between the main controller 580 and each of these components may be made using HDLC.

Figure 7:
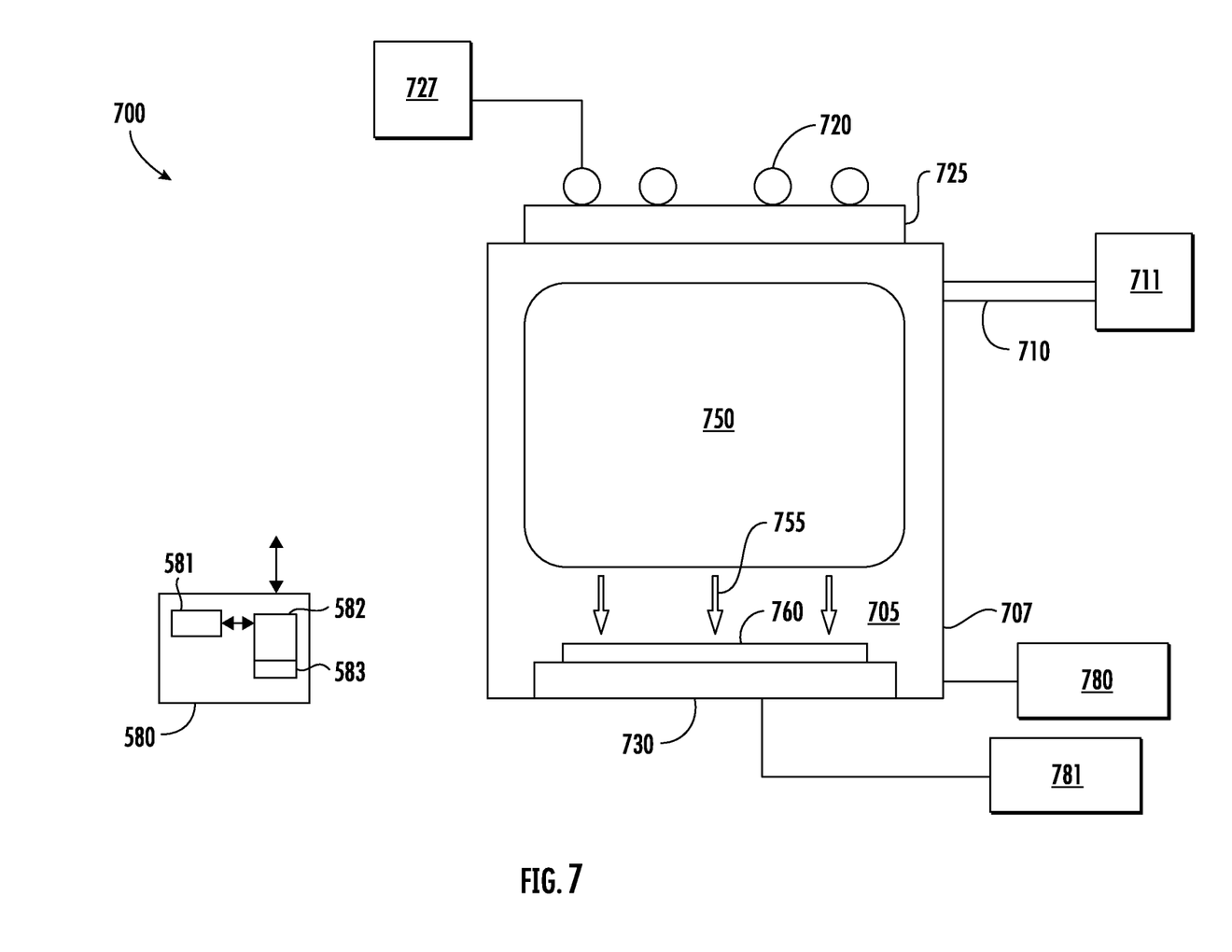
FIG. 7 is a plasma doping system in accordance with one embodiment that may use the HDLC system and method described herein.

FIG. 7 shows another semiconductor processing system, which is a PLAD (plasma doping) system 700. The PLAD system 700 includes a plasma chamber 705 defined by several walls 707, which may be constructed from graphite, silicon, silicon carbide, aluminum, or another suitable material. This plasma chamber 705 may be supplied with a feed gas, which is contained in a feed gas source 711, via a feed gas inlet 710. This feed gas may be energized by a plasma generator. In some embodiments, an RF antenna 720 or another mechanism is used to create plasma 750. The RF antenna 720 is in electrical communication with a RF power supply 727 which supplies power to the RF antenna 720. A dielectric window 725, such as a quartz or alumina window, may be disposed between the RF antenna 720 and the interior of the plasma chamber 705.

Ions 755 in the plasma 750, which are positively charged, are attracted to the workpiece 760 by the difference in potential between the plasma chamber 705 (which defines the potential of the plasma 750) and the workpiece 760. In some embodiments, the walls 707 may be more positively biased than the workpiece 760. For example, the walls 707 may be in electrical communication with a chamber power supply 780, which is positively biased. In this embodiment, the workpiece 760 is in communication with a platen 730, which is in communication with bias power supply 781, which is biased at a voltage lower than that applied by chamber power supply 780. In certain embodiments, the bias power supply 781 may be maintained at ground potential. In a second embodiment, the chamber power supply 780 may be grounded, while the bias power supply 781 may be biased at a negative voltage. While these two embodiments describe either the workpiece 760 or the walls 707 being at ground potential, other embodiments are also possible. The ions 755 from the plasma 750 are attracted to the workpiece 760 as long as the walls 707 are biased at a voltage greater than the voltage applied to the platen 730.

The feed gas source 711 may be any suitable gas. In certain embodiments, the various gas sources may be containers, such as canisters that hold the respective gas.

The main controller 580 has a processing unit 581 and an associated memory device 582. This memory device 582 contains the instructions 583, which, when executed by the processing unit 581, enable the system to control the PLAD system 700. This memory device 582 may be any non-transitory storage medium, including a non-volatile memory, such as a FLASH ROM, an electrically erasable ROM or other suitable devices. In other embodiments, the memory device 582 may be a volatile memory, such as a RAM or DRAM. In certain embodiments, the main controller 580 may be a general purpose computer, an embedded processor, or a specially designed microcontroller. The actual implementation of the main controller 580 is not limited by this disclosure.

The main controller 580 may receive input signals from a variety of systems and components and provide output signals to each to control the same. For example, the main controller 580 may control the flow of feed gas and diluent gas. Further, the main controller 580 may control the voltages applied by the RF power supply 727, chamber power supply 780 and bias power supply 781. The main controller 580 may also receive inputs from other components.

As noted above, HDLC may be used to communicate between the various devices in the semiconductor processing system.

Figure 1A:
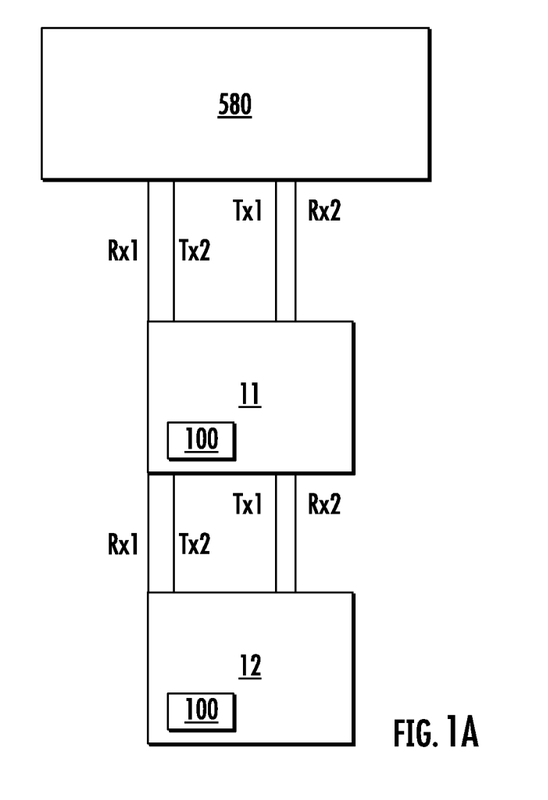
FIG. 1A shows a plurality of devices connected using HDLC protocol.

FIG. 1A shows the configuration of several devices using the techniques described herein. These devices may be one or more of the components described with respect to FIGS. 5-7.

The main controller 580 may be used to control all of the devices. The devices may be configured in a daisy chain fashion, such that signals transmitted by the main controller 580 that are destined for second device 12 are first received by first device 11 on its input port. The first device 11 then retransmits these signals to second device 12 using its output port. While FIG. 1A shows two devices, it is understood that there may be many more devices that are daisy chained together. These devices are typically connected using optical cables. Note that each of the devices 11, 12 includes a microcontroller 100. This devices 11, microcontroller 100 comprises the hardware and instructions to implement the methods described below.

Figure 1B:
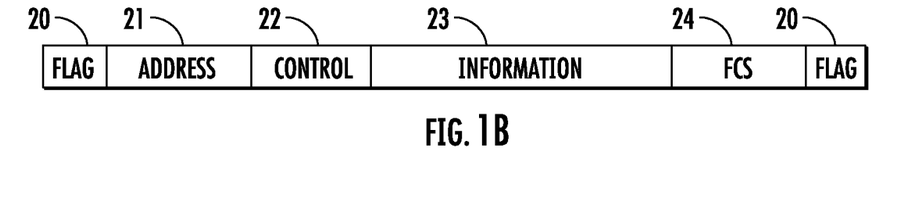
FIG. 1B shows the format of a HDLC packet.

FIG. 1B shows the format of a HDLC packet. The packet begins with a flag 20, which is defined as 0x7E (i.e., 01111110). It is noted that this is the only place in the data stream where six "1"s may appear consecutively. If the data to be transmitted contains 6 or more consecutive "1" s, a zero bit (i.e., "0") is stuffed after the fifth "1". This is referred to as zero stuffing. Thus, a string of 8 "1"s in a row would be transmitted as 5 "1" s, a "0" and 3 more "1" s. The fact that the flag is the only location where 6 consecutive "1"s may appear is used by the system, as described in more detail below. Following the flag 20 is the address field 21. The address field 21 denotes the identity of the device which the packet is intended for. Following the address field 21 is the control field 22. Next is the information 23, which may be variable in length. The information 23 is followed by a field check sequence (FCS) 24, which is used to verify the correctness of the earlier transmitted data. Finally, the packet ends with the transmission of another flag 20. Note that between packets, a series of flags are continuously transmitted.

Thus, the flag, which is 0x7E, would be encoded and transmitted as "01111110". A series of 2 flags would result in the sequence "0111111001111110". Note that during the time that no packets are being transmitted, the incoming data appears as a string of 2 pulses, where one pulse is 6 bits in length and the second pulse is 2 bits in length. This can be advantageously used to decode incoming data without relying on a phase locked clock. Note that in certain embodiments, two consecutive flags may be transmitted as "011111101111110", where the trailing zero of the first flag is shared with the leading zero of the second flag.

Figure 2:
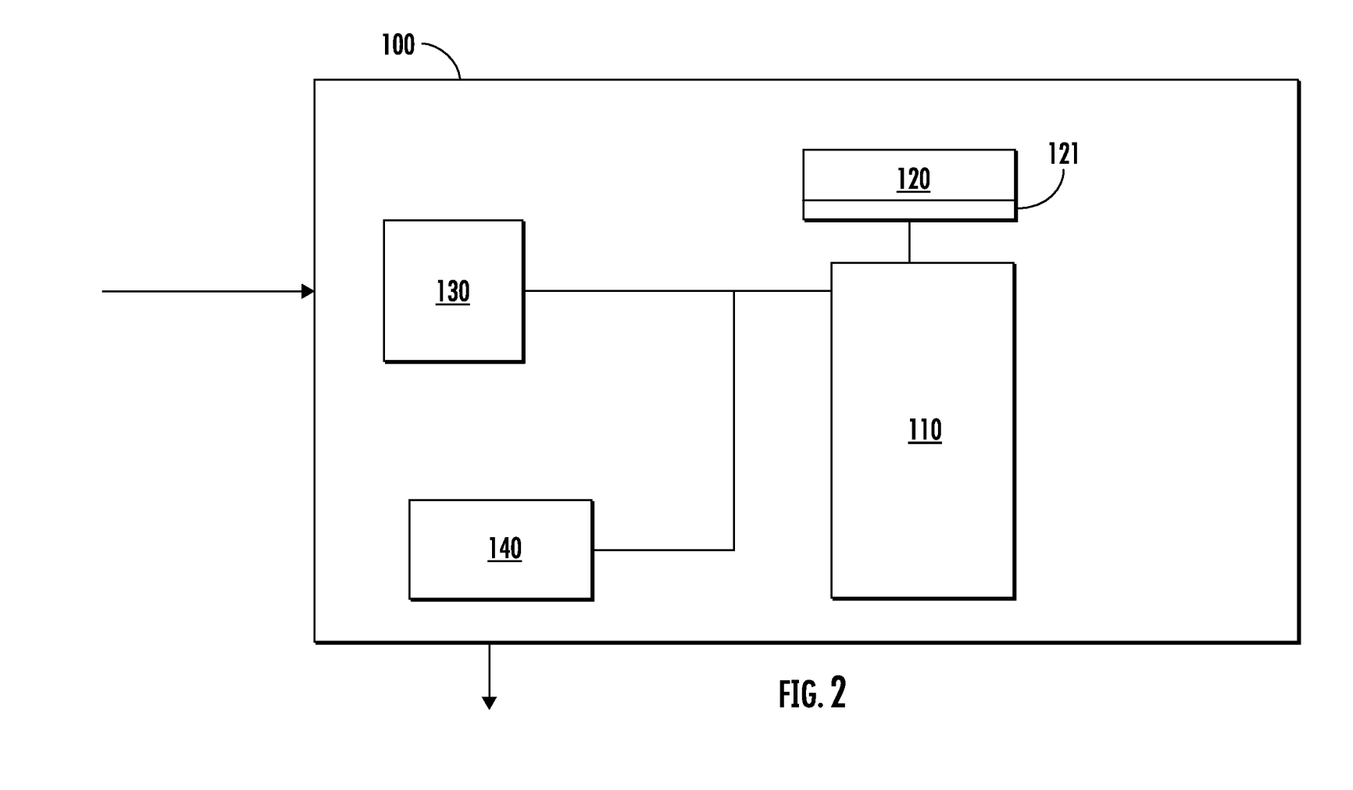
FIG. 2 shows a block diagram of a microcontroller that implements the methods described herein.

As noted above, a microcontroller 100 may be used to implement the HDLC reception techniques described herein. FIG. 2 shows a block diagram of the microcontroller 100. The microcontroller 100 may be a generic microcontroller, such as a PIC microcontroller, an 8051 microcontroller, or another commodity part. Alternatively, the microcontroller 100 may be a custom component. In all embodiments, the microcontroller 100 includes several components. The microcontroller 100 includes a processing unit 110. The processing unit 110 may be an ARM based processor, in certain embodiments, although other processing units may be used. The microcontroller 100 includes an associated memory device 120, which contains instructions 121 that allow the microcontroller 100 to perform the methods described herein. The memory device 120 may be a volatile memory, such as RAM or DRAM. Alternatively, or additionally, the memory device 120 may be a non-volatile memory, such as FLASH or electrically programmable ROM. The microcontroller 100 also includes an edge detector/timer circuit 130. The edge detector/timer circuit 130 is configured to measure the time of arrival of an edge of an incoming signal, such as a rising edge or the falling edge, and present that time stamp to the processing unit 110. The edge detector/timer circuit 130 may operate using a high speed clock, such as 20 MHz as an example. Thus, in this embodiment, the time stamps are accurate to within 50 nanoseconds. In certain embodiments, the time is stored in a memory location within the memory device 120. In some embodiments, the edge detector/timer circuit 130 also may be configured to generate an interrupt to the processing unit 110 when a transition is present on the incoming signal. In certain embodiments, different interrupt routines may be invoked based on the polarity of the transition. The microcontroller 100 also includes an output port 140, which may be a general purpose output or may be a SPI (serial peripheral interface) port. The microcontroller 100 uses the output port 140 to transmit HDLC packets using techniques that are known in the art.

Advantageously, the edge detector/timer circuit 130 may be used to receive the incoming HDLC signal from another device or from the main controller 580. Based on the timing of the sequential incoming pulses, the incoming data stream can be reconstructed.

Figure 3:
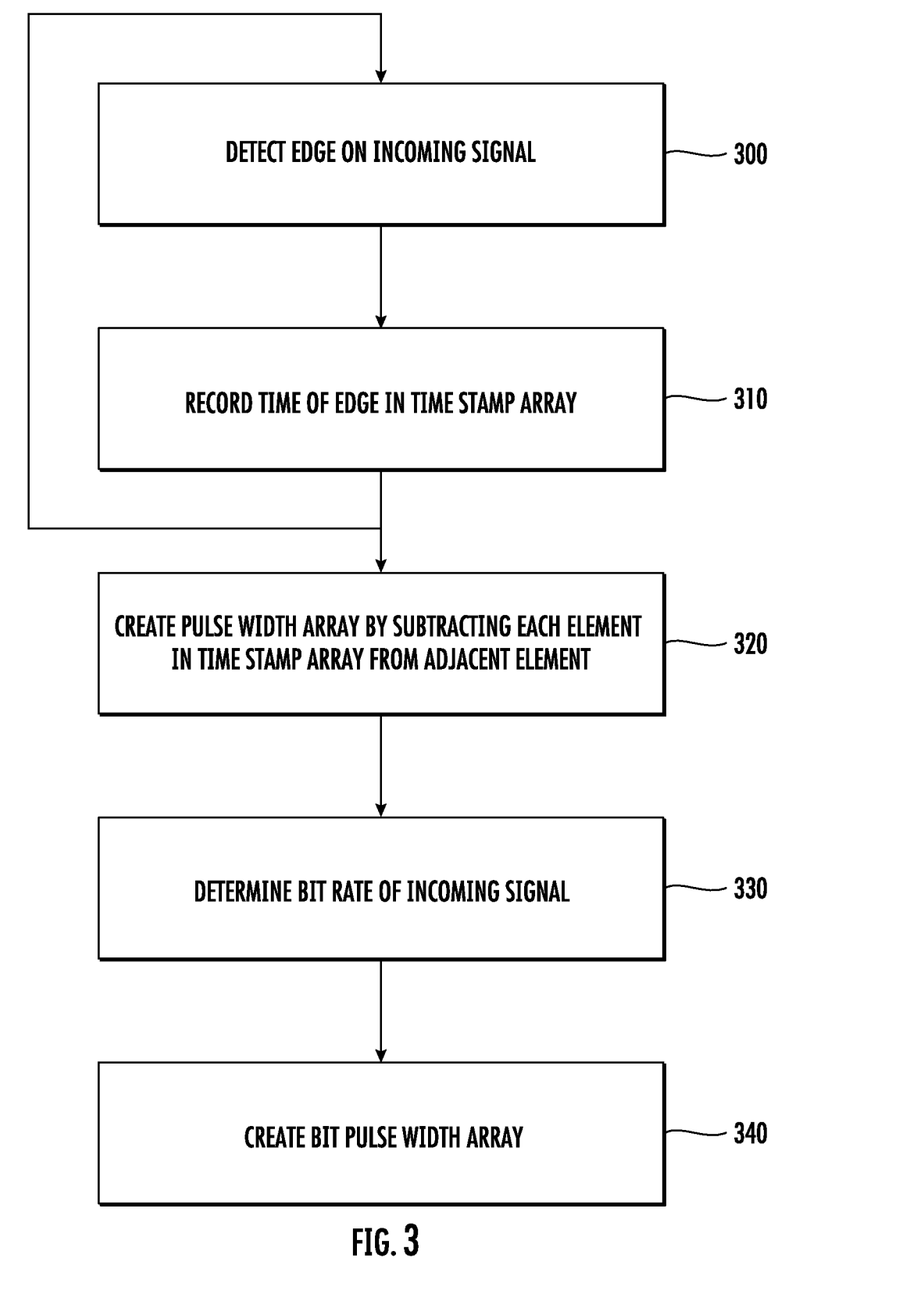
FIG. 3 shows a sequence to generate a bit pulse width array from the timer values.

A flow chart showing a sequence that may be used to determine the data rate of the incoming data signal is shown in FIG. 3. First, as shown in Box 300, the edge detector/timer circuit 130 detects a signal edge. Next, as shown in Box 310, the edge detector/timer circuit 130 records the time that a signal edge was received, this time may be saved in the memory device 120, as time stamp array as TS[1]. This sequence repeats a plurality of times. For example, the edge detector/timer circuit 130 records the time that the next signal edge was received; this time may be saved in the memory device 120 as TS[2]. This process continues and an array of time stamps, TS[N: 0] is created.

Next, as shown in Box 320, the processing unit 110 may create an array of pulse widths (PW). This is achieved by subtracting each time stamp from the next time stamp. Thus, the pulse width array can be defined as PS[N−1]=TS[N]−TS[N−1]. The difference in time between two transitions is equal to the pulse width.

Note that in some implementations, the edge detector/timer circuit 130 may compute the duration of each pulse, based on the edge detections. In these implementations, the sequence shown in Boxes 300-320 may be omitted, as the data from the edge detector/timer circuit 130 provides the values for the pulse width array.

Note that when packets are not being transmitted, this process may result in a pulse width array of alternating pulse widths where the longer pulse width is roughly 6 bit times and the shorter pulse width is roughly 2 bit times (i. e., [~6*bit time, ~2*bit time, ~6*bit time, ~2*bit time, . . . ], where bit time is the time to transmit one bit). In other embodiments, where the 0 between two consecutive flags is shared, this process may result in a pulse width array of alternating pulse widths where the longer pulse width is roughly 6 times longer than the shorter pulse width. Next, as shown in Box 330, the processing unit 110 may determine the bit rate of the incoming data signal. This may be done in several ways. In one embodiment, the shortest pulse width is defined as the time associated with transmitting a single bit. In another embodiment, ⅙ of the longest positive pulse width is defined as the time associated with transmitting a single bit. In another embodiment, an average time is generated using both pulse widths. In another embodiment, the two values in the pulse width array that repeat when packets are not being transmitted are used to determine the time associated with transmitting a single bit. In this configuration, the processing unit 110 may use the longest positive pulse width (which is 6 bits long) and a second pulse width (which may be 1 or 2 bits in duration, as described above) to determine the time associated with transmitting a single bit. This time associated with the transmission of a single bit may be defined as bit time. Note that bit rate is simply the inverse of bit time. In another embodiment, the pulses may be categorized as positive pulses and negative pulses, where the bit time for positive pulses may differ from the bit time of negative pulses due to the asymmetry of rise and fall times. Note that the sequence shown in FIG. 3 to determine the bit rate of the incoming data may be performed once at initialization or many times. For example, this sequence may be performed anytime that packets are not being transmitted.

Once the bit time is determined, the pulse width array (PW[N−1:0]) may be converted from being based on time, to being based on bit time. Thus, as shown in Box 340, each entry in the PW array may be divided by the bit time. The results of this division may be rounded to the nearest whole number. This process yields the bit pulse width array, BPW[N−1:0] where each entry is the number of bits associated with each pulse width.

Finally, the process also determines which pulses in the bit pulse width array are positive pulses and which are negative pulses. This may be done in a variety of ways. In one embodiment, a different interrupt routine may be executed when rising edges (or failing edges) are detected by the edge detector/timer circuit 130. Once the polarity of a pulse is identified, it is known that every other pulse will be the same polarity. For example, if the first pulse is a positive pulse, then the third, fifth, seventh, etc. pulses will also be positive pulses. In another embodiment, the processing unit 110 may sample the data signal to determine its polarity.

Note that this bit pulse width array was generated without knowing in advance the clock frequency of the transmitter. Further, this bit pulse width array was generated without synchronizing an internal clock to the incoming data signal.

Once the bit pulse width array is generated, the actual data can be decoded. Using the rules regarding zero stuffing, the incoming bit stream can be decoded from the bit pulse width array.

Figure 4:
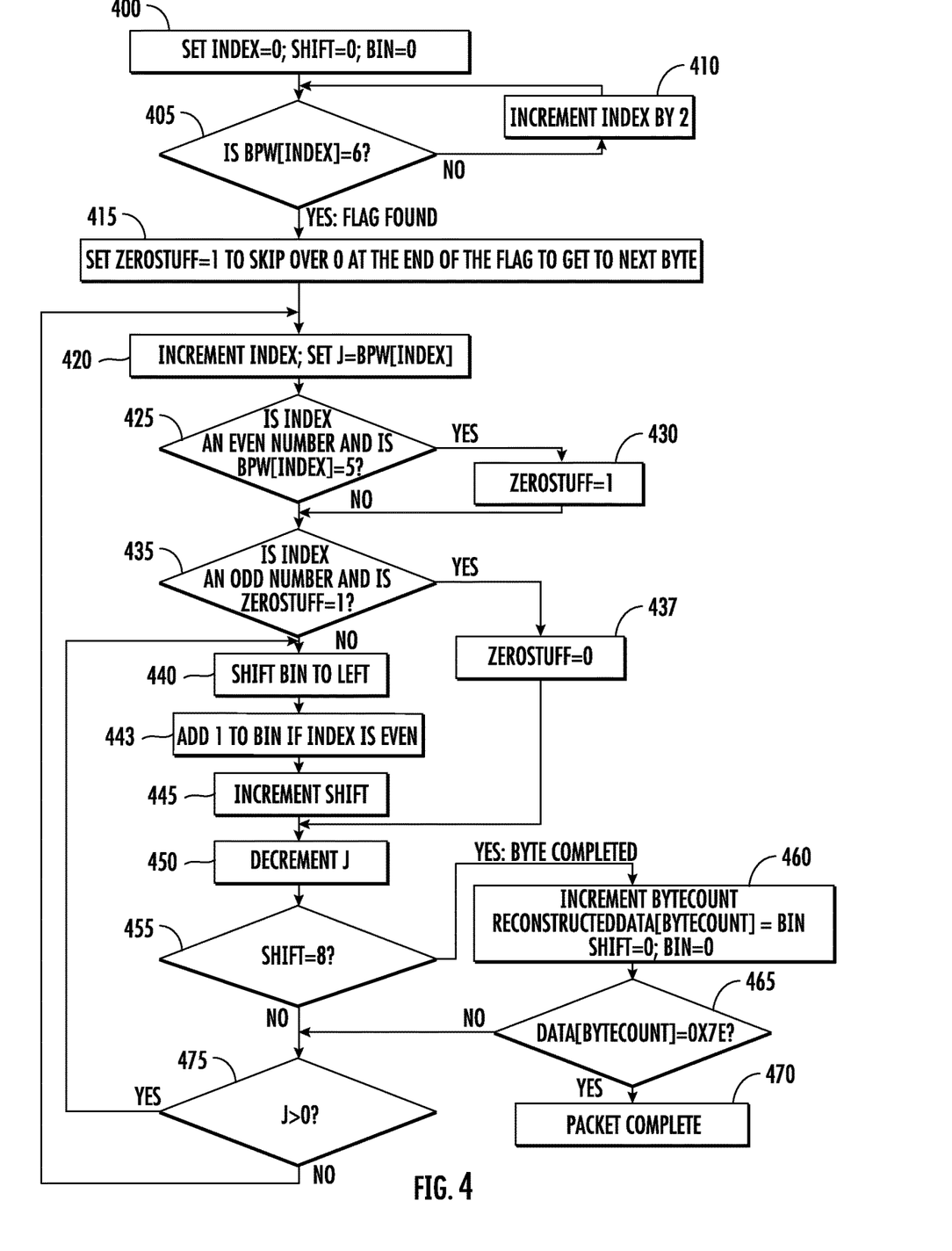
FIG. 4 shows one example of how to reconstruct the incoming data using the bit pulse width array.

FIG. 4 shows a flowchart that shows how the data may be obtained from the bit pulse width array. Note that there are other ways to generate the data, and FIG. 4 is one example.

First, as shown in Box 400, the processing unit 110 initializes some variables. In this example, index refers to the index into the bit pulse width array; shift is the bit position in the reconstructed data byte and bin holds the reconstructed data as it is being created. In this example, it is assumed that even numbered entries in the bit pulse width array are positive pulses and odd numbered entries represent pulses that are comprised of "O" bits. Of course, the sequence can be modified to accommodate other configurations.

Next, as shown in Box 405, the processing unit 110 checks if the value of this bit pulse width array (BPW [index]) is equal to 6, indicating that it is a flag 20. Note that this example assumes that the flag 20 is the beginning of the packet. Note that additional checks may be added to FIG. 4 to account for the repeated flags during times when no packets are being transmitted. For example, the sequence may check the next two entries in the bit pulse width array to see if they represent another flag 20. If BPW[index] is not equal to 6, the index is incremented by 2 (to move to the next positive pulse) in Box 410 and these processes are repeated until the flag is found.

Note that the flag is actually 0x7E, so after the pulse that has six "1" s, there is a trailing "0" in the next pulse. This trailing "0" is part of the flag 20 and needs to be ignored so as to align to the byte boundary. Thus, in Box 415, the zerostuff flag is set to 1.

Next, as shown in Box 420, the index is incremented to move to the next entry in the bit pulse width array. Additionally, a counter (J) is initialized to the value of the bit pulse width array.

Next, as shown in Box 425, the processing unit 110 checks to see if this pulse width is a set of five consecutive "1" s. As noted above, if 5 or more "1"s appear, a "0" is inserted into the data stream. If the value of the bit pulse width array indicates that this is a positive pulse that is 5 bits long, the zerostuff flag is set, as shown in Box 430.

Next, the processing unit 110 checks to see if the current entry in the bit pulse width array is associated with a pulse of consecutive "0"s and if the zerostuff flag is set in Box 435. If it is set, the next bit is a "0" which is to be removed. Thus, if zerostuff is not set, the bin is shifted to the left, indicating that a "0" has been added, as shown in Box 440. Next, if this is a positive pulse, a "1" is added to the bin, as shown in Box 443. Additionally, as shown in Box 445, the variable shift is incremented. If the zerostuff flag is set, it is cleared, as shown in Box 437 and Boxes 440-445 are skipped.

Since a bit has been copied into the bin, the counter J is decremented, as shown in Box 450.

Next, the processing unit 110 checks to see if an entire byte has been assembled by comparing the value of shift to 8, as shown in Box 455. If a byte has not been completed, the processing unit 110 checks if the value of J is greater than 0, as shown in Box 475. If J is positive, the processing unit returns to Box 440 and repeats the sequence described above. This process repeated until J reaches 0. Note that if shift is equal to 8, the processing unit 110 copies the value of bin to the reconstructed data array. As shown in Box 460, the processing unit 110 then resets the shift variable and increments the bytecount, which indicates the length of this packet. The value of newest value in the reconstructed data array is then compared to 0x7E, as shown in Box 465. If the value of the reconstructed data array is 0x7E, the processing unit recognizes this as the flag that terminates the packet. Thus, as shown in Box 470, this completes receipt of the packet.

Returning to Box 475, if all of the bits in the current value of the bit pulse width array have been processed, the processing unit returns to Box 420, where the index is incremented. The process described above is then repeated.

As stated above, other processes may be used to generate the reconstructed data, and this is only one example. Further, some of the processes described in FIG. 4 may be executed in a different order. However, in all embodiments, the creation of the reconstructed data is performed using a series of timed pulse widths. Further, a clock that is phase locked to the incoming signal is not used in any of these embodiments.

Note that once the packet is reconstructed, the microcontroller may perform other operations. For example, the microcontroller may check if the packet is intended for this device by checking address the field 21. Additionally, the microcontroller may verify the integrity of the packet by checking the FCS field 24. This is done using a CRC-16 algorithm.

The embodiments described above in the present application may have many advantages. First, the use of a microcontroller to perform the sequences to receive and reconstruct HDLC packets means that specialized hardware, such as HDLC controllers or custom logic, does not have to be used, thus saving cost and potentially space on the printed circuit boards used for the various devices. Second, the present system is much less sensitive to jitter and signal degradation. For example, it is typical that the duration of a pulse width may decrease as it traversed the daisy chain. If the pulse width becomes sufficiently small, systems that utilize a fixed clock to detect the data may detect errors. However, in the present system, the bit rate is computed based on incoming pulse widths and is not reliant on any fixed or phase locked clock.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A microcontroller for receiving HDLC (High-level Data Link Control) packets, comprising:
    a processing unit;
    an edge detector/timer circuit;
    a memory device in communication with the processing unit, containing instructions, which when executed by the processing unit, enable the microcontroller to:
        use the edge detector/timer circuit to record durations of a plurality of pulse widths of an incoming signal, wherein the incoming signal is a HDLC packet;
        determine a bit rate based on the durations of the plurality of pulse widths; and
        reconstruct the HDLC packet based on the bit rate previously determined,
        wherein an array of pulse widths is stored, and the processing unit uses values in the array of pulse widths to determine a bit time, defined as a time to transmit one bit, and divides the array of pulse widths by the bit time to create an array of bit pulse widths, where each value in the array of bit pulse widths is indicative of a number of bits in each pulse.

2. The microcontroller of claim 1, wherein the processing unit defines a smallest pulse width as the bit time.

3. The microcontroller of claim 1, wherein the processing unit uses a longest positive pulse width to determine the bit time.

4. The microcontroller of claim 1, wherein the processing unit uses a longest positive pulse width and a second pulse width to determine the bit time.

5. The microcontroller of claim 1, wherein the processing unit uses the array of bit pulse widths to reconstruct the HDLC packet.

6. The microcontroller of claim 1, wherein the edge detector/timer circuit records a timestamp for each transition of the incoming signal, and the timestamps are stored in the memory device.

7. The microcontroller of claim 6, wherein the durations of the plurality of pulse widths are calculated by subtracting each timestamp from an adjacent timestamp.

8. The microcontroller of claim 1, wherein the edge detector/timer circuit times a duration between transitions of the incoming signal and records the durations of the plurality of pulse widths.

9. A beamline ion implantation system, comprising:
    a plurality of components defining a beamline, comprising an ion source, a mass analyzer, a mass resolving aperture, at least one acceleration or deceleration stage, a collimator, and a platen; and
    a main controller, in communication with one or more of the plurality of components, wherein at least one component of the one or more of the plurality of components comprises the microcontroller of claim 1.

10. A spot beam implementation system, comprising:
    a plurality of components defining a beamline, comprising an ion source, a mass analyzer, a mass resolving aperture, a scanner, an angle corrector and a platen; and
    a main controller, in communication with one or more of the plurality of components, wherein at least one component of the one or more of the plurality of components comprises the microcontroller of claim 1.

11. A plasma doping system, comprising:
    a plurality of components, comprising a plasma chamber, an RF antenna, an RF power supply, a platen, a bias power supply, a mass analyzer, a mass resolving aperture, a scanner, an angle corrector and a platen; and
    a main controller, in communication with one or more of the plurality of components, wherein at least one component of the one or more of the plurality of components comprises the microcontroller of claim 1.

12. A microcontroller for receiving HDLC (High-level Data Link Control) packets, comprising:
    a processing unit;
    an edge detector/timer circuit;
    a memory device in communication with the processing unit, containing instructions, which when executed by the processing unit, enable the microcontroller to:
        use the edge detector/timer circuit to record durations of a plurality of pulse widths of an incoming signal, wherein the incoming signal is a HDLC packet;
        determine a bit rate based on the durations of the plurality of pulse widths; and
        reconstruct the HDLC packet based on the bit rate previously determined,
        wherein the edge detector/timer circuit records a timestamp for each transition of the incoming signal, and the timestamps are stored in the memory device.

13. The microcontroller of claim 12, wherein the durations of the plurality of pulse widths are calculated by subtracting each timestamp from an adjacent timestamp.

* * * * *